US012575252B2

(12) United States Patent
Lee et al.

(10) Patent No.: US 12,575,252 B2
(45) Date of Patent: Mar. 10, 2026

(54) COMPOSITION, AND ELECTRONIC DEVICE AND ORGANIC LIGHT-EMITTING DEVICE COMPRISING SAME

(71) Applicant: LG Chem, Ltd., Seoul (KR)

(72) Inventors: Won Jung Lee, Daejeon (KR); Su Youn Han, Daejeon (KR); Woochul Lee, Daejeon (KR); Byung Hyun Park, Daejeon (KR); Byoung Hyoun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 781 days.

(21) Appl. No.: 17/916,651

(22) PCT Filed: Aug. 3, 2021

(86) PCT No.: PCT/KR2021/010142
§ 371 (c)(1),
(2) Date: Oct. 3, 2022

(87) PCT Pub. No.: WO2022/030946
PCT Pub. Date: Feb. 10, 2022

(65) Prior Publication Data

US 2023/0141364 A1 May 11, 2023

(30) Foreign Application Priority Data

Aug. 5, 2020 (KR) ........................ 10-2020-0098145

(51) Int. Cl.
*H10K 50/12* (2023.01)
*H10K 85/60* (2023.01)

(52) U.S. Cl.
CPC ........... *H10K 50/12* (2023.02); *H10K 85/615* (2023.02)

(58) Field of Classification Search
CPC ...... H10K 50/11; H10K 50/12; H10K 85/342; H10K 85/615; H10K 85/654; H10K 85/6572
See application file for complete search history.

(56) References Cited

U.S. PATENT DOCUMENTS

2011/0121269 A1 5/2011 Lecloux et al.
2012/0256173 A1 10/2012 Kitamura et al.
(Continued)

FOREIGN PATENT DOCUMENTS

CN 104292218 A 1/2015
JP 2006023137 A 1/2006
(Continued)

OTHER PUBLICATIONS

International Search Report for Application No. PCT/KR2021/010142 mailed Dec. 6, 2021, pp. 1-3.
(Continued)

*Primary Examiner* — Golam Mowla
(74) *Attorney, Agent, or Firm* — Lerner David LLP

(57) ABSTRACT

The present specification relates to a composition including two or more compounds represented by Chemical Formula 1 and having a different number of deuterium substitution, wherein, in the composition, the number of deuterium of an isotope having a highest isotope content among each isotope content for each mass number of the two or more compounds having a different number of deuterium substitution is 12 or greater, and an electronic device and an organic light emitting device including the same.

8 Claims, 3 Drawing Sheets

(56) References Cited

U.S. PATENT DOCUMENTS

| | | | | |
|---|---|---|---|---|
| 2015/0084016 | A1 | 3/2015 | Watanabe et al. | |
| 2018/0010040 | A1 | 1/2018 | Pan et al. | |
| 2021/0288260 | A1 | 9/2021 | Han et al. | |
| 2021/0320265 | A1 | 10/2021 | Song et al. | |
| 2022/0069223 | A1 | 3/2022 | Kim et al. | |
| 2022/0393110 | A1* | 12/2022 | Lee | H10K 85/615 |
| 2023/0042023 | A1 | 2/2023 | Tasaki et al. | |

FOREIGN PATENT DOCUMENTS

| | | | | |
|---|---|---|---|---|
| JP | 2007205745 | A | 8/2007 | |
| JP | 2010256104 | A | 11/2010 | |
| JP | 202083881 | A | 6/2020 | |
| KR | 20090046731 | A * | 5/2009 | H10K 85/615 |
| KR | 20100069216 | A | 6/2010 | |
| KR | 20120026095 | A | 3/2012 | |
| KR | 20170025869 | A | 3/2017 | |
| KR | 101978650 | B1 | 5/2019 | |
| KR | 20190056338 | A | 5/2019 | |
| KR | 20200030003 | A | 3/2020 | |
| KR | 20200034649 | A | 3/2020 | |
| KR | 20200063085 | A | 6/2020 | |
| KR | 20200081983 | A | 7/2020 | |
| KR | 20200090123 | A | 7/2020 | |
| TW | 201130798 | A | 9/2011 | |
| TW | 201441206 | A | 11/2014 | |
| TW | 201639946 | A | 11/2016 | |
| WO | 2010135395 | A2 | 11/2010 | |
| WO | 2016086885 | A1 | 6/2016 | |
| WO | 2018095384 | A1 | 5/2018 | |
| WO | 2020080416 | A1 | 4/2020 | |
| WO | 2020149666 | A1 | 7/2020 | |

OTHER PUBLICATIONS

Search Report dated Dec. 18, 25 from the Office Action for Chinese Application No. 202180020164.9 issued Dec. 20, 25. 2 pgs.

* cited by examiner

【FIG. 1】
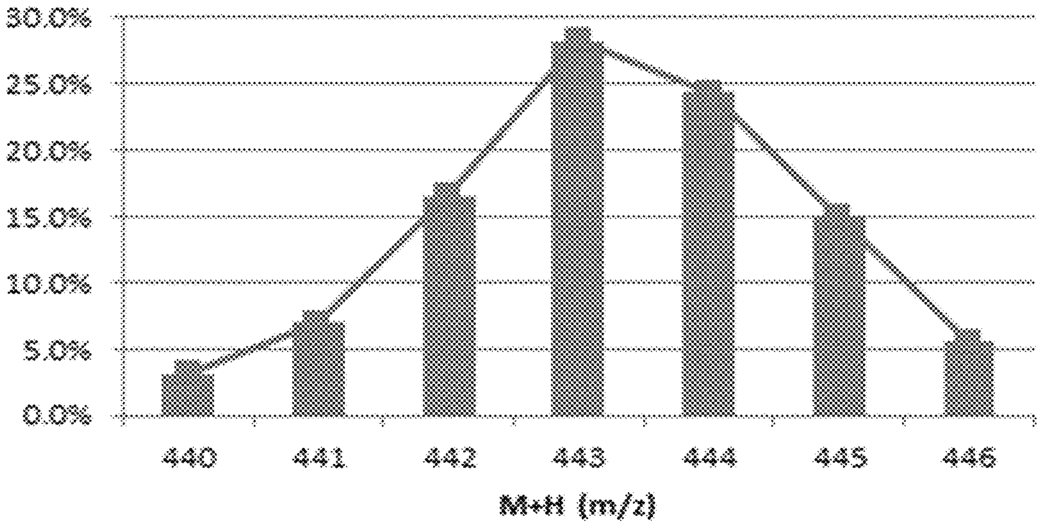
【FIG. 2】
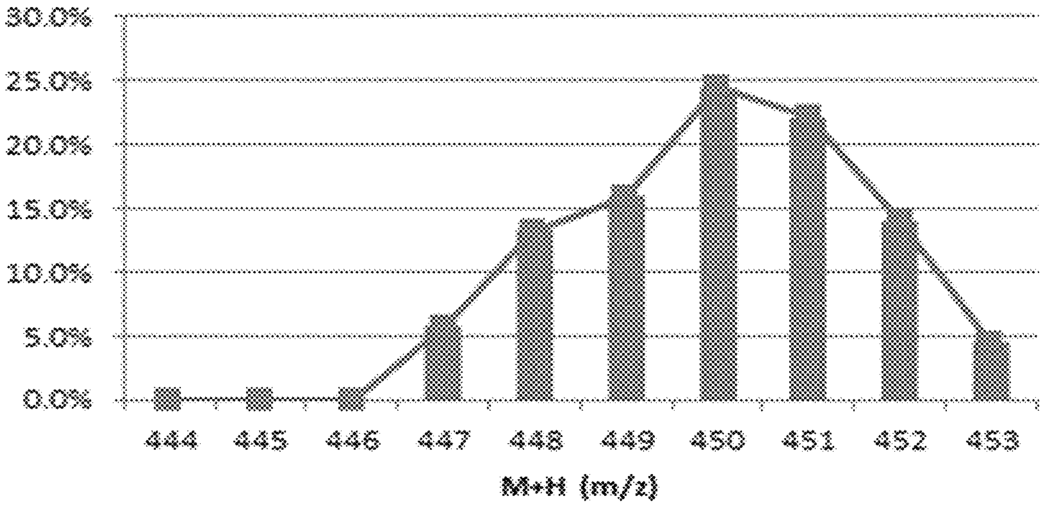

【FIG. 3】
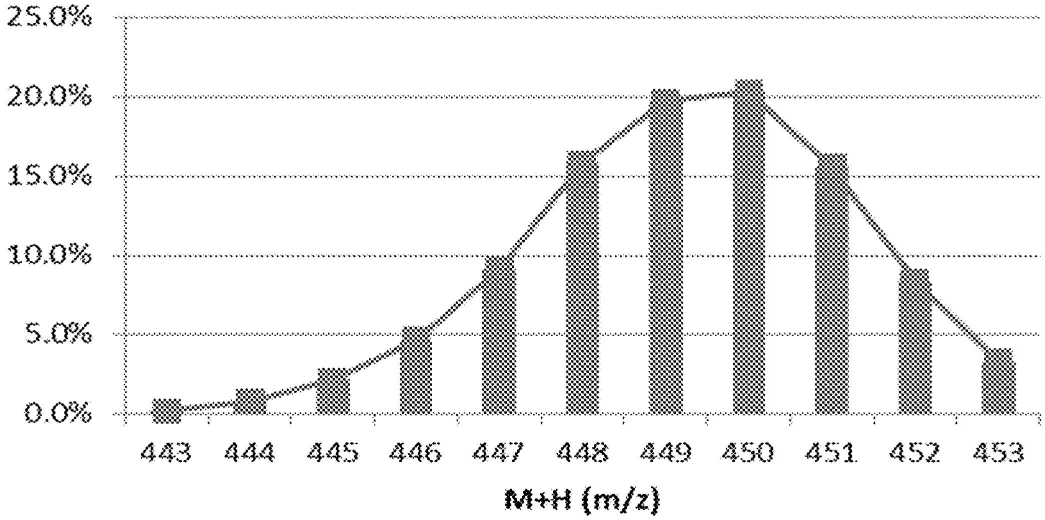
【FIG. 4】
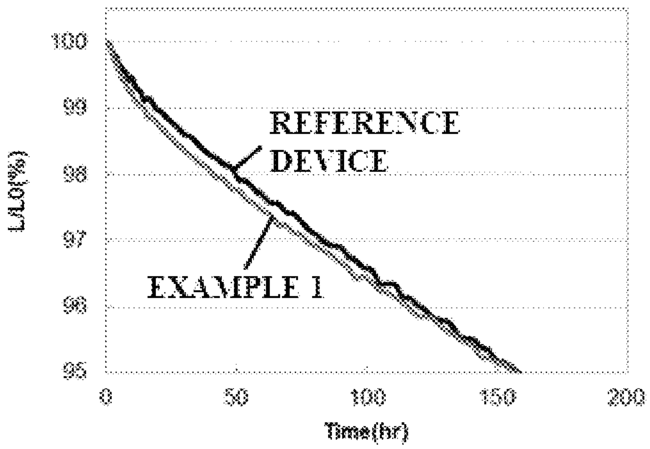

【FIG. 5】
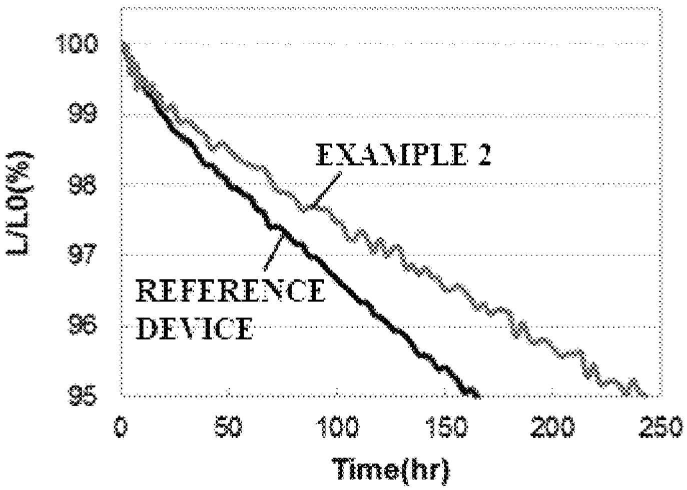

COMPOSITION, AND ELECTRONIC DEVICE AND ORGANIC LIGHT-EMITTING DEVICE COMPRISING SAME

CROSS-REFERENCE TO RELATED APPLICATION(S)

The present application is a national stage entry under 35 U.S.C. § 371 of International Application No. PCT/KR2021/010142 filed on Aug. 3, 2021, which claims priority from Korean Patent Application No. 10-2020-0098145 filed on Aug. 5, 2020, all the disclosures of which are incorporated herein by reference.

TECHNICAL FIELD

The present specification relates to a composition including a deuterated compound, and an electronic device and an organic light emitting device including the same.

BACKGROUND ART

Compounds including deuterium are used for various purposes. For example, compounds including deuterium are widely used for drugs, pesticides, organic EL materials and other purposes as well as used as a labeling compound for identifying chemical reaction mechanisms or identifying metabolism.

A method of substituting an aromatic compound with deuterium to enhance a lifetime of an organic light emitting device (OLED) material is known. A principle of such an effect is that lifetime properties of an OLED material are enhanced as a C-D bond becomes to have a lower LUMO energy than a C—H bond when substituted with deuterium.

A deuterated compound prepared through a deuteration reaction is prepared to a composition having two or more isotopes with different molecular weights depending on the number of deuterium substituted, and, since distribution depending on the substitution ratio of deuterium and the number of deuterium affects performance of a device manufactured therewith, analysis on the distribution depending on the substitution ratio of deuterium and the number of deuterium, and studies on compounds having optimal distribution depending on the number of deuterium have been required.

DISCLOSURE

Technical Problem

The present specification is directed to providing a composition including a deuterated compound, and an electronic device and an organic light emitting device including the same.

Technical Solution

One embodiment of the present specification provides a composition including two or more compounds represented by the following Chemical Formula 1 and having a different number of deuterium substitution, wherein, in the composition, the number of deuterium of an isotope having a highest isotope content for each mass number of the two or more compounds having a different number of deuterium substitution is 12 or greater.

[Chemical Formula 1]

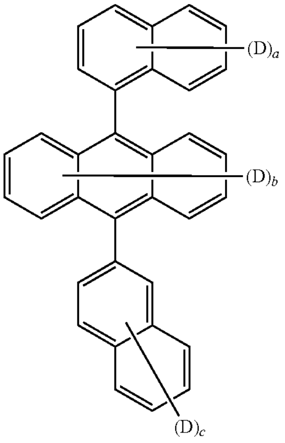

In Chemical Formula 1, a to c mean the number of deuterium, a sum of a to c is 1 or greater and 22 or less, a and c are each an integer of 0 to 7, and b is an integer of 0 to 8.

In addition, one embodiment of the present specification provides an electronic device including the composition described above.

In addition, one embodiment of the present specification provides an organic light emitting device including a first electrode; a second electrode provided opposite to the first electrode; and an organic material layer provided between the first electrode and the second electrode, wherein the organic material layer includes the composition described above.

Advantageous Effects

The present specification has derived a substitution ratio by the number of deuterium substitution of a deuterium-substituted compound, and has accumulated characteristics and performance relationship depending on the number of deuterium.

DESCRIPTION OF DRAWINGS

FIG. 1 shows an isotope content for each mass number (area %) of Example 1.

FIG. 2 shows an isotope content for each mass number (area %) of Example 2.

FIG. 3 shows an isotope content for each mass number (area %) of Example 3.

FIG. 4 is a graph evaluating a lifetime of Example 1.

FIG. 5 is a graph evaluating a lifetime of Example 2.

MODE FOR DISCLOSURE

Hereinafter, the present specification will be described in detail.

When all hydrogens of a compound are substituted with deuterium theoretically, that is, when a deuterium substitution ratio is 100%, lifetime properties are enhanced most ideally. However, problems such as requiring extreme conditions due to steric hindrance or destroying the compound before deuteration due to side reactions occur, and in reality, a 100% deuterium substitution ratio for all hydrogens of the compound is difficult to obtain, and even when the deuterium substitution ratio is close to 100%, investment efficiency is not favorable considering process time, costs and the like.

In addition, when the deuterium substitution ratio is a certain level or higher, the degree of enhancing lifetime properties resulting from an increase in the deuterium substitution ratio decreases, and therefore, identifying the degree of deuteration producing a valid effect is important.

In the present specification, a deuterated compound prepared through a deuteration reaction is prepared to a composition having two or more isotopes with different molecular weights depending on the number of deuterium substituted, and, since distribution depending on the substitution ratio of deuterium and the number of deuterium affects performance of a device manufactured therewith, distribution depending on the number of deuterium as well as the substitution ratio of deuterium has been analyzed, and a substitution ratio depending on the number of deuterium producing a valid effect has been identified.

One embodiment of the present specification provides a composition including two or more compounds represented by the following Chemical Formula 1 and having a different number of deuterium substitution, wherein, in the composition, the number of deuterium of an isotope having a highest isotope content for each mass number of the two or more compounds having a different number of deuterium substitution is 12 or greater.

One embodiment of the present specification provides a composition including two or more compounds represented by the following Chemical Formula 1 and having a different number of deuterium substitution, wherein, in the composition, the number of deuterium of an isotope having a highest substitution ratio by the number of deuterium of the two or more compounds having a different number of deuterium substitution is 12 or greater.

[Chemical Formula 1]

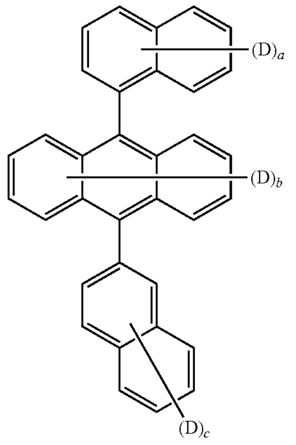

In Chemical Formula 1, a to c mean the number of deuterium, a sum of a to c is 1 or greater and 22 or less, a and c are each an integer of 0 to 7, and b is an integer of 0 to 8.

When manufacturing a device using a deuterium-substituted compound, performance of the device using the compound becomes more favorable as a deuteration substitution ratio of the used compound increases.

In the present specification, a device manufactured using a deuterated compound in which, even with a somewhat lower deuteration substitution ratio compared to a compound having a deuteration substitution ratio closer to 100%, the number of deuterium of an isotope having a highest isotope content for each mass number is 12 or greater exhibits an equal or higher lifetime-increasing effect without declining device performance compared to a device manufactured using a compound that does not go through a deuterium substitution reaction.

In the present specification, the number of deuterium of an isotope having a highest isotope content for each mass number being 12 or greater means that a device using the deuterium-substituted compound exhibits equal or higher lifetime properties compared to a device using a compound that does not go through a deuteration reaction. Specifically, in the present specification, the number of deuterium of an isotope having a highest isotope content for each mass number being 12 or greater represents meaningful results by the deuterium substitution reaction.

In the present specification, the number of deuterium of an isotope having a highest substitution ratio by the number of deuterium being 12 or greater means that a device using the deuterium-substituted compound exhibits equal or higher lifetime properties compared to a device using a compound that does not go through a deuteration reaction. Specifically, in the present specification, the number of deuterium of an isotope having a highest substitution ratio by the number of deuterium being 12 or greater represents meaningful results by the deuterium substitution reaction.

In the present specification, the number of deuterium of an isotope having a highest substitution ratio by the number of deuterium may be 21 or less, 20 or less, 19 or less, 18 or less, 17 or less, 16 or less, 15 or less, 14 or less or 13 or less. In this case, meaningful results are obtained by the deuterium substitution reaction without increasing a deuterium substitution ratio through a severe deuteration reaction, and as a result, a deuteration process may be minimized and manufacturing costs of a deuterated compound may be lowered.

A deuterated compound prepared through a deuteration reaction is prepared while two or more isotopes having different molecular weights depending on the number of deuterium are mixed, and therefore, the compound obtained through a deuteration reaction may be considered as a composition including two or more compounds having a different number of deuterium substitution.

In the present specification, the isotope content for each mass number is a value derived by analyzing a mass chromatogram of the composition obtained using chromatography. Specifically, the isotope content for each mass number is a value derived based on an area of a mass chromatogram of the composition obtained using chromatography.

In the present specification, the substitution ratio by the number of deuterium is a value derived by analyzing a mass chromatogram of the composition obtained using chromatography. Specifically, the substitution ratio by the number of deuterium is a value obtained by converting an isotope content for each mass number in the composition derived based on an area of a mass chromatogram of the composition using chromatography to a substitution ratio by the number of deuterium through the following Equation 1.

[Equation 1]

$$\text{substitution ratio by the number of deuterium (\%)} = \frac{\text{isotope content for each mass number (\%)} \times \text{number of deuterium}}{\text{average number of deuterium substitution}}$$

[Equation 2]

$$\text{average number of deuterium substitution} = \frac{\text{sum of products of isotope content for each mass number (\%)} \times \text{and number of deuterium for each mass number}}{100}$$

In Equation 1 and Equation 2, the number of deuterium means the number of deuterium for each mass number of the isotope, and the average number of deuterium substitution is a value calculated from Equation 2.

In the present specification, the substitution ratio by the number of deuterium may be obtained by, after separating the composition by chromatography, calculating an isotope content for each mass number of the composition based on an area of a mass chromatogram for each isotope having a different mass number obtained by a mass analysis, and converting the calculated isotope content for each mass number to the substitution ratio by the number of deuterium through Equation 1.

In one embodiment of the present specification, the chromatography may be liquid chromatography, and may preferably be high performance liquid chromatography. Specifically, the deuterated compound of Chemical Formula 1 subject to the analysis has a large molecular weight, and is preferably separated through liquid chromatography.

In one embodiment of the present specification, the mass chromatogram for each isotope may be obtained by,

- separating the composition by chromatography, and then mass analyzing the result,
- deriving a mass spectrum for each isotope having a different mass number from a total ion chromatogram obtained by the mass analysis, and
- deriving an individual mass chromatogram of an isotope having a different mass number from the obtained mass spectrum.

In one embodiment of the present specification, the isotope content for each mass number of the composition may be calculated based on an area of the mass chromatogram derived using the above-described process.

In one embodiment of the present specification, an area of the extracted ion chromatogram for each isotope having a different mass number is obtained, and a percentage of the area of the ion chromatogram calculated based on a total area of the total ion chromatogram obtained by the mass analysis is an isotope content for each mass number of the composition. The isotope content for each mass number derived using such a method is based on a total area of the total ion chromatogram, and therefore, a sum of these is 100%.

In the composition, isotope molecular weights depending on the number of deuterium substituted are identified based on the deuterated compound represented by Chemical Formula 1, a subject of the analysis, and the identified isotope molecular weights depending on the number of deuterium are matched to the mass number (m/z) of the extracted ion chromatogram.

For example, among the compounds of Chemical Formula 1, the compound having the number of deuterium substitution of 12 has a molecular weight of approximately 443 g/mol, and a percentage of the area of the extracted ion chromatogram with a mass number of 443 m/z based on the total area of the total ion chromatogram is an isotope content for each mass number of the deuterated compound having 12 deuterium.

In one embodiment of the present specification, a sum of the isotope content for each mass number of the compounds having the number of deuterium substitution of 12 or greater may be 70% or greater in the composition. In other words, a sum of each isotope content for each mass number of the compounds having the number of deuterium substitution of 12 to 22 is 70% or greater in the composition.

In one embodiment of the present specification, a sum of the substitution ratio by the number of deuterium of the compounds having the number of deuterium substitution of 12 or greater may be 70% or greater in the composition. In other words, a sum of each substitution ratio by the number of deuterium of the compounds having the number of deuterium substitution of 12 to 22 is 70% or greater in the composition.

A compound substituted with deuterium heavier than hydrogen has lower zero-point energy than a compound that does not go through a deuterium substitution reaction, which reduces vibrational energy, and therefore, a decrease in the quantum efficiency caused by intermolecular interactions is prevented. As a result, a lifetime of a device using the deuterium-substituted compound increases.

It is identified that the tendency of decreasing quantum efficiency and increasing a lifetime described above starts from when a sum of each isotope content for each mass number of the compounds having the number of deuterium substitution of 12 to 22 is 73.1% or greater in the composition.

It is identified that the tendency of decreasing quantum efficiency and increasing a lifetime described above starts from when a sum of each substitution ratio by the number of deuterium of the compounds having the number of deuterium substitution of 12 to 22 is 77.1% or greater in the composition.

In one embodiment of the present specification, a sum of the isotope content for each mass number of the compounds having the number of deuterium substitution of 12 or greater may be 40% or greater, 42% or greater, 44% or greater, 46% or greater, 47% or greater, 49% or greater, 50% or greater, 55% or greater, 60% or greater, 65% or greater, 70% or greater, 71% or greater, 72% or greater, 73% or greater, 74% or greater, 75% or greater, 80% or greater, 85% or greater, 90% or greater, 95% or greater or 100% in the composition.

In one embodiment of the present specification, a sum of the isotope content for each mass number of the compounds having the number of deuterium substitution of 12 or greater may be 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 85% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the substitution ratio by the number of deuterium of the compounds having the number of deuterium substitution of 12 or greater may be 40% or greater, 41% or greater, 42% or greater, 43% or greater, 44% or greater, 45% or greater, 46% or greater, 47% or greater, 48% or greater, 49% or greater, 50% or greater, 55% or greater, 60% or greater, 65% or greater, 70% or greater, 75% or greater, 80% or greater, 85% or greater, 90% or greater, 95% or greater or 100% in the composition.

In one embodiment of the present specification, a sum of the substitution ratio by the number of deuterium of the compounds having the number of deuterium substitution of 12 or greater may be 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 81% or less, 82% or less, 83% or less, 84% or less, 85% or less, 86% or less, 87% or less, 88% or less, 89% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the isotope content for each mass number of the compounds having the number of deuterium substitution of 13 or greater may be 40% or greater, 42% or greater, 44% or greater, 46% or greater, 47% or greater, 49% or greater, 50% or greater, 55% or greater, 60% or greater, 65% or greater, 70% or greater, 71% or greater, 72% or greater, 73% or greater, 74% or greater, 75% or greater, 80% or greater, 85% or greater, 90% or greater, 95% or greater or 100% in the composition.

In one embodiment of the present specification, a sum of the isotope content for each mass number of the compounds having the number of deuterium substitution of 13 or greater may be 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 85% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the substitution ratio by the number of deuterium of the compounds having the number of deuterium substitution of 13 or greater may be 40% or greater, 41% or greater, 42% or greater, 43% or greater, 44% or greater, 45% or greater, 46% or greater, 47% or greater, 48% or greater, 49% or greater, 50% or greater, 55% or greater, 60% or greater, 65% or greater, 70% or greater, 75% or greater, 80% or greater, 85% or greater, 90% or greater, 95% or greater or 100% in the composition.

In one embodiment of the present specification, a sum of the substitution ratio by the number of deuterium of the compounds having the number of deuterium substitution of 13 or greater may be 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 81% or less, 82% or less, 83% or less, 84% or less, 85% or less, 86% or less, 87% or less, 88% or less, 89% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the isotope content for each mass number of the compounds having the number of deuterium substitution of 14 or greater may be 20% or greater, 22% or greater, 24% or greater, 26% or greater, 27% or greater, 29% or greater, 30% or greater, 35% or greater, 40% or greater, 42% or greater, 44% or greater, 46% or greater, 47% or greater, 49% or greater, 50% or greater, 55% or greater, 60% or greater, 65% or greater, 70% or greater, 71% or greater, 72% or greater, 73% or greater, 74% or greater, 75% or greater, 80% or greater, 85% or greater, 90% or greater, 95% or greater or 100% in the composition.

In one embodiment of the present specification, a sum of the isotope content for each mass number of the compounds having the number of deuterium substitution of 14 or greater may be 25% or less, 27% or less, 30% or less, 40% or less, 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 85% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the substitution ratio by the number of deuterium of the compounds having the number of deuterium substitution of 14 or greater may be 20% or greater, 22% or greater, 24% or greater, 26% or greater, 27% or greater, 29% or greater, 30% or greater, 35% or greater, 40% or greater, 41% or greater, 42% or greater, 43% or greater, 44% or greater, 45% or greater, 46% or greater, 47% or greater, 48% or greater, 49% or greater, 50% or greater, 55% or greater, 60% or greater, 65% or greater, 70% or greater, 75% or greater, 80% or greater, 85% or greater, 90% or greater, 95% or greater or 100% in the composition.

In one embodiment of the present specification, a sum of the substitution ratio by the number of deuterium of the compounds having the number of deuterium substitution of 14 or greater may be 25% or less, 27% or less, 30% or less, 40% or less, 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 81% or less, 82% or less, 83% or less, 84% or less, 85% or less, 86% or less, 87% or less, 88% or less, 89% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the isotope content for each mass number of the compounds having the number of deuterium substitution of 15 or greater may be 1% or greater, 2% or greater, 3% or greater, 4% or greater, 5% or greater, 6% or greater, 10% or greater, 15% or greater, 20% or greater, 22% or greater, 24% or greater, 26% or greater, 27% or greater, 29% or greater, 30% or greater, 35% or greater, 40% or greater, 42% or greater, 44% or greater, 46% or greater, 47% or greater, 49% or greater, 50% or greater, 55% or greater, 60% or greater, 65% or greater, 70% or greater, 71% or greater, 72% or greater, 73% or greater, 74% or greater, 75% or greater, 80% or greater, 85% or greater, 90% or greater, 95% or greater or 100% in the composition.

In one embodiment of the present specification, a sum of the isotope content for each mass number of the compounds having the number of deuterium substitution of 15 or greater may be 10% or less, 20% or less, 30% or less, 40% or less, 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 85% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the substitution ratio by the number of deuterium of the compounds having the number of deuterium substitution of 15 or greater may be 1% or greater, 2% or greater, 3% or greater, 4% or greater, 5% or greater, 6% or greater, 10% or greater, 15% or greater, 20% or greater, 22% or greater, 24% or greater, 26% or greater, 27% or greater, 29% or greater, 30% or greater, 35% or greater, 40% or greater, 41% or greater, 42% or greater, 43% or greater, 44% or greater, 45% or greater, 46% or greater, 47% or greater, 48% or greater, 49% or greater, 50% or greater, 55% or greater, 60% or greater, 65% or greater, 70% or greater, 75% or greater, 80% or greater, 85% or greater, 90% or greater, 95% or greater or 100% in the composition.

In one embodiment of the present specification, a sum of the substitution ratio by the number of deuterium of the compounds having the number of deuterium substitution of 15 or greater may be 10% or less, 20% or less, 30% or less, 40% or less, 50% or less, 51% or less, 52% or less, 53% or less, 54% or less, 55% or less, 56% or less, 57% or less, 58% or less, 59% or less, 60% or less, 70% or less, 75% or less, 76% or less, 77% or less, 77.5% or less, 78% or less, 79% or less, 80% or less, 81% or less, 82% or less, 83% or less, 84% or less, 85% or less, 86% or less, 87% or less, 88% or less, 89% or less, 90% or less, 91% or less, 92% or less, 93% or less, 94% or less, 95% or less, 96% or less, 97% or less, 98% or less, 99% or less or 100% or less in the composition.

In one embodiment of the present specification, a sum of the isotope content for each mass number of the compounds having an equal or higher number of deuterium of the isotope having a highest isotope content for each mass number may be 40% or greater and 75% or less, and may specifically be 45% or greater and 75% or less in the composition.

In one embodiment of the present specification, a sum of the substitution ratio by the number of deuterium of the compounds having an equal or higher number of deuterium of the isotope having a highest substitution ratio by the number of deuterium may be 45% or greater and 80% or less, and may specifically be 47% or greater and 80% or less, or 50% or greater and 80% or less in the composition.

One embodiment of the present specification provides an electronic device including the composition described above.

One embodiment of the present specification provides a method for manufacturing an electronic device, the method including manufacturing an electronic device using the composition described above.

The electronic device and the method for manufacturing an electronic device may cite the descriptions on the composition, and repeated descriptions will not be included.

The electronic device is not particularly limited as long as it is a device capable of using a deuterated compound, and examples thereof may include an organic light emitting device, an organic phosphorescent device, and organic solar cell, an organic photo conductor, an organic transistor and the like.

The electronic device includes a first electrode; a second electrode provided opposite to the first electrode; and one or more organic material layers provided between the first electrode and the second electrode, wherein one or more layers of the organic material layers may include the composition described above.

When the electronic device is an organic light emitting device, the organic material layer includes a light emitting layer, and the light emitting layer may include the composition described above.

When the electronic device is an organic light emitting device, the organic light emitting device may have a structure further including a layer selected from among a hole injection layer, a hole transfer layer, a light emitting layer, an electron transfer layer, an electron injection layer and the like as the organic material layer.

In the present specification, the composition described above may also be used in an electronic device including an organic phosphorescent device, an organic solar cell, an organic photo conductor, an organic transistor and the like under a similar principle used in the organic light emitting device. For example, the organic solar cell may have a structure including an anode, a cathode and a photoactive layer provided between the anode and the cathode, wherein the photoactive layer may include the composition described above.

One embodiment of the present specification provides an organic light emitting device including a first electrode; a second electrode provided opposite to the first electrode; and an organic material layer provided between the first electrode and the second electrode, wherein the organic material layer includes the composition described above.

One embodiment of the present specification provides a method for manufacturing an organic light emitting device, the method including manufacturing an organic light emitting device using the composition described above.

One embodiment of the present specification provides a method for manufacturing an organic light emitting device, the method including manufacturing an organic light emitting device including a first electrode; a second electrode provided opposite to the first electrode; and an organic material layer provided between the first electrode and the second electrode, wherein the organic material layer includes the composition described above.

The organic light emitting device and the method for manufacturing an organic light emitting device may cite the descriptions on the composition, and repeated descriptions will not be included.

In the present specification, the organic material layer includes a light emitting layer, and the light emitting layer may include the composition described above.

In the present specification, the organic material layer includes a light emitting layer including a host and a dopant, and the host may include the composition described above.

Hereinafter, the present specification will be described in more detail with reference to examples. However, the following examples are for illustrative purposes only, and not for limiting the present specification.

EXAMPLE

Experimental Example 1

Compositions of Examples 1 and 2 each obtained by conducting a deuteration reaction with a compound of the following Chemical Formula 2 in a different manner were dissolved in tetrahydrofuran (THF) (0.2 mg/mL), and then analyzed using high performance liquid chromatography/mass spectrometry (HPLC/MS) set under a condition as in the following Table 1.

[Chemical Formula 2]

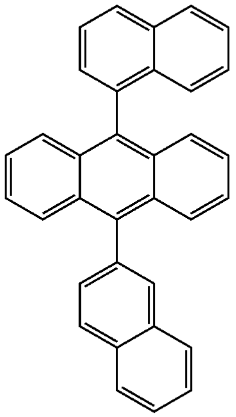

TABLE 1

| HPLC/UV | |
|---|---|
| Mobile phase | A: Acetonitrile/Tetrahydrofuran (constantratio)<br>B: Water |
| Run time | 10 min |
| Injection volume | 1-10 µL |
| Detector | PDA detector |
| HPLC-APCI/MS | |
| Capillary | 10-20 kV |
| Cone voltage | 30-70 V |
| Source temperature | 100-150° C. |
| Cone gas flow | 50-200 L/hr |

An isotope content for each mass number (%) that is percentage of the area for each mass number of the extracted ion chromatogram based on the total area of the total ion chromatogram, a substitution ratio by the number of deuterium (%) obtained by converting this value through Equation 1, and an average deuterium substitution ratio (%) are matched to the number of deuterium and shown in Table 2 and Table 3.

The following Table 2 and FIG. 1 are experimental results of Example 1.

TABLE 2

| | | | | | | | |
|---|---|---|---|---|---|---|---|
| Number of Deuterium | 9 | 10 | 11 | 12 | 13 | 14 | 15 |
| Number of Hydrogen | 13 | 12 | 11 | 10 | 9 | 8 | 7 |
| m + H (m/z) | 440 | 441 | 442 | 443 | 444 | 445 | 446 |
| Isotope Content for Each Mass Number (%) | 3.2 | 7.0 | 16.6 | 28.2 | 24.4 | 14.9 | 5.6 |
| Substitution Ratio by the Number of Deuterium (%) | 2.3 | 5.7 | 14.8 | 27.5 | 25.8 | 17.0 | 6.8 |
| Average Deuterium Substitution Ratio (%) | | | | 56.0% | | | |

The average number of deuterium substitution calculated from the information of Table 2 is 12.3, and this is a value calculated from {(9×3.2)+(10×7.0)+(11×16.6)+(12×28.2)+(13×24.4)+(14×14.9)+(15×5 0.6)}/100 according to Equation 2. The substitution ratio by the number of deuterium calculated from the information of Table 2 is a value calculated according to Equation 1. When taking the case in which the mass number is 443 m/z as an example, the value is calculated as 27.5%, which results from 28.2%×12/12.3. The following Table 3 and FIG. 2 are experimental results of Example 2.

TABLE 3

| | | | | | | | |
|---|---|---|---|---|---|---|---|
| Number of Deuterium | 16 | 17 | 18 | 19 | 20 | 21 | 22 |
| Number of Hydrogen | 6 | 5 | 4 | 3 | 2 | 1 | 0 |
| m + H (m/z) | 447 | 448 | 449 | 450 | 451 | 452 | 453 |
| Isotope Content for Each Mass Number (%) | 5.8 | 13.2 | 16.0 | 24.4 | 22.1 | 14.0 | 4.5 |
| Substitution Ratio by the Number of Deuterium (%) | 4.9 | 11.8 | 15.1 | 24.4 | 23.2 | 15.4 | 5.2 |
| Average Deuterium Substitution Ratio (%) | | | | 86.5% | | | |

The average number of deuterium substitution calculated from the information of Table 3 is 19.03, and this is a value calculated from {(16×5.8)+(17×13.2)+(18×16.0)+(19×24.4)+(20×22.1)+(21×14.0)+(22×4.5)}/100 according to Equation 2. The substitution ratio by the number of deuterium calculated from the information of Table 3 is a value calculated according to Equation 1. When taking the case in which the mass number is 450 m/z as an example, the value is calculated as 24.4%, which results from 24.4%×19/19.03. The following Table 4 and FIG. 3 are experimental results of Example 3.

TABLE 4

| | | | | | | | | | | | |
|---|---|---|---|---|---|---|---|---|---|---|---|
| Number of Deuterium | 12 | 13 | 14 | 15 | 16 | 17 | 18 | 19 | 20 | 21 | 22 |
| Number of Hydrogen | 10 | 9 | 8 | 7 | 6 | 5 | 4 | 3 | 2 | 1 | 0 |
| m + H (m/z) | 443 | 444 | 445 | 446 | 447 | 448 | 449 | 450 | 451 | 452 | 453 |
| Isotope Content for Each Mass Number (%) | 0.2 | 0.8 | 2.1 | 4.7 | 9.1 | 15.8 | 19.7 | 20.3 | 15.6 | 8.3 | 3.3 |
| Substitution Ratio by the Number of Deuterium (%) | 0.1 | 0.6 | 1.6 | 3.9 | 8.0 | 14.7 | 19.4 | 21.1 | 17.1 | 9.5 | 4.0 |
| Average Deuterium Substitution Ratio (%) | | | | | | 83.1% | | | | | |

The average number of deuterium substitution calculated from the information of Table 4 is 18.26, and this is a value calculated from {(12×0.2)+(13×0.8)+(14×2.1)+(15×4.7)+(16×9.1)+(17×15.8)+(18×19.7)+(19×20.3)+(20×15.6)+(21×8.3)+(22×3.3)}/100 according to Equation 2. The substitution ratio by the number of deuterium calculated from the information of Table 4 is a value calculated according to Equation 1. When taking the case in which the mass number is 451 m/z as an example, the value is calculated as 17.1%, which results from 15.6%×20/18.26.

Experimental Example 2

For the compositions of Examples 1 to 3, HPLC Area % and information on related properties among the information of Table 2 to Table 4 are summarized and shown in the following Table 5.

Herein, the device for the lifetime test for device evaluation was manufactured in the following order, and the compounds before/after deuterium substitution were used as a light emitting layer host.

1) Remove residual organic materials in a vacuum chamber.

2) Introduce approximately 1 g of each organic material deposit to a crucible inside the vacuum chamber, and the vacuum chamber was under vacuum of $10^{-6}$ torr to $10^{-5}$ torr for a day.

3) Introduce an ITO (indium tin oxide) substrate into the vacuum chamber, and the organic material suitable for each layer was deposited while moving the ITO substrate to obtain an organic material layer. Herein, each layer was deposited to a thickness capable of obtaining favorable device efficiency.

4) Deposit Al (cathode) on the organic material layer to manufacture an organic light emitting device.

5) In the vacuum chamber, conduct encapsulation using epoxy, and take out the result from the vacuum chamber.

For the manufactured device, the lifetime was measured compared to a reference device through a rate of time-dependent decrease in the luminance, and the results are shown in FIG. 4 and FIG. 5. Herein, on the y axis, L is real-time luminance, and LO is initial luminance.

The reference device used when measuring the lifetime is a device manufactured using a compound represented by the following Chemical Formula 2. Specifically, the reference device means a device manufactured using a compound represented by the following Chemical Formula 2 that does not go through a deuteration reaction.

[Chemical Formula 2]

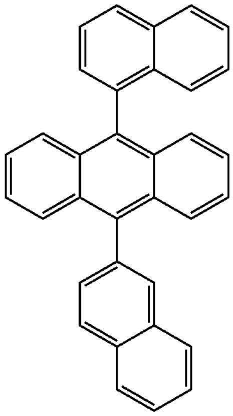

TABLE 5

| | | Isotope Content for Each Mass Number (Area %) | | |
|---|---|---|---|---|
| | | Example 1 | Example 2 | Example 3 |
| Number of Deuterium Substitution (Number) | 9 | 3.2% | — | — |
| | 10 | 7.0% | — | — |
| | 11 | 16.6% | — | — |
| | 12 | 28.2% | — | 0.2% |
| | 13 | 24.4% | — | 0.8% |
| | 14 | 14.9% | — | 2.1% |
| | 15 | 5.6% | — | 4.7% |
| | 16 | — | 5.8% | 9.1% |
| | 17 | — | 13.2% | 15.8% |
| | 18 | — | 16.0% | 19.7% |
| | 19 | — | 24.4% | 20.3% |
| | 20 | — | 22.1% | 15.6% |
| | 21 | — | 14.0% | 8.3% |
| | 22 | — | 4.5% | 3.3% |
| Number of Maximum Ratio Substitution (Most Abundance) | | 12 | 19 | 19 |
| Sum of Area % Having D ≥ 12 | | 73.1% | 100% | 100% |
| Sum of Area % Having D ≥ Most Abundance | | 73.1% | 65% | 47.5% |
| Sum of Substitution Ratio by the Number of Deuterium Having D ≥ 12 | | 77.1% | 100% | 100% |
| Sum of Substitution Ratio by the Number of Deuterium Having D ≥ Most Abundance | | 77.1% | 68.2% | 51.7% |
| Result of Device Evaluation | | 100% | 150% | 135% |

The device using each of the deuterium-substituted compounds of Examples 1 to 3 exhibited equal or higher lifetime performance compared to the device using the compound represented by Chemical Formula 2 that did not go through a deuteration reaction. Through Table 5, it was identified that the number of minimum deuterium substitution having a maximum ratio (most abundance) was 12, and it was seen that performance of the device was not inferior compared to the device manufactured with the compound of Chemical Formula 2 even with a somewhat low deuteration substitution ratio.

Herein, even when a deuteration reaction was performed on the same compound, the average deuterium substitution ratio and/or the substitution ratio by the number of deuterium may vary by varying factors such as a deuterium source type, a deuterium source content, an organic solvent type, an organic solvent amount, a reaction time, a reaction temperature and a catalyst type.

Factors varied to analyze the difference in the deuterium substitution ratio in the present specification are the content of benzene-d6, the content of organic solvent participating in the reaction, the number of benzene-d6 reuse and/or the ratio of benzene-d6 amount before/after reuse in the deuteration reaction.

Experimental Example 3

Synthesis Example

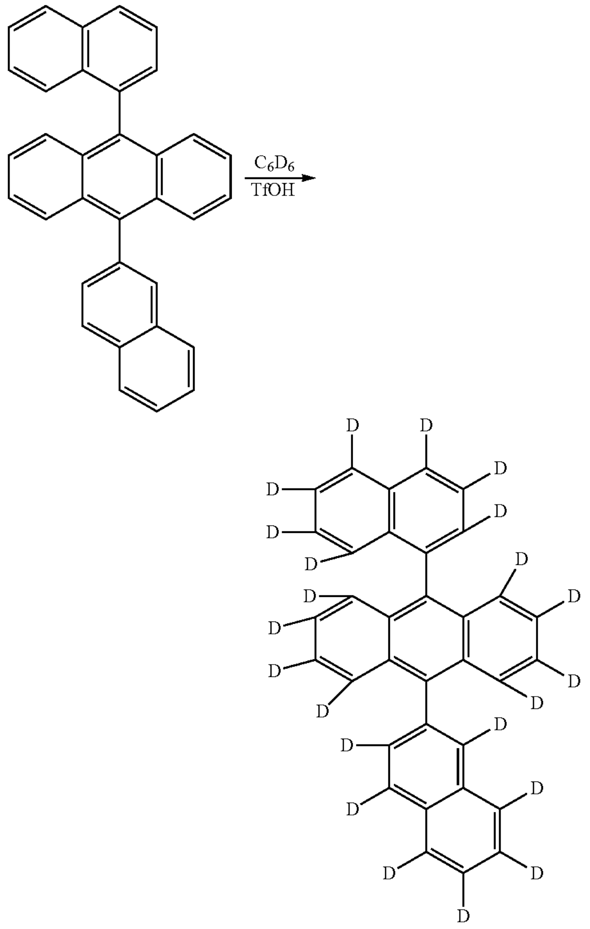

Chemical Formula 2 (9-(naphthalen-1-yl)-10-(naphthalen-2-yl)anthracene) (20 g) and trifluoromethanesulfonic acid (TfOH) were introduced to $C_6D_6$ (1000 ml, 285 eq.), and stirred for 2 hours at 70° C. After the reaction was finished, $D_2O$ (100 ml) was introduced thereto, and, after stirring the result for 30 minutes, trimethylamine (6 ml) was added dropwise thereto. The reaction solution was transferred to a separatory funnel, and extracted with water and toluene. The extract was dried with $MgSO_4$, and then recrystallized with ethyl acetate to obtain the deuterated compound of Chemical Formula 2 in a 64% yield. [Cal. m/s: 452.55, exp. m/s (M+) 448 to 452]

As shown in the following Table 6, a deuteration reaction was conducted with Chemical Formula 2 while varying a type of benzene-d6, and as a deuterium substitution ratio of benzene-d6 was lower, the amount of TfOH was increased in order to compensate the lowered deuterium substitution ratio. Herein, the 'deuterium substitution ratio' of benzene-d6 is a deuterium substitution ratio of the whole benzene-d6, and the 'ratio of D6' is a ratio of benzene-D6 in the distribution depending on the number of deuterium among benzene-d6.

Herein, benzene-d6 includes benzene-D6 having all 6 hydrogens of benzene substituted with deuterium, but also includes other benzene including, among the 6 hydrogens of benzene, hydrogens not substituted with deuterium. In other words, benzene-d6 is a composition including each compound that may be classified as benzene-DO, benzene-D1, benzene-D2, benzene-D3, benzene-D4, benzene-D5 and benzene-D6 depending on the number substituted with deuterium among the 6 hydrogens of benzene.

The total deuterium substitution ratio of Chemical Formula 2 was measured through high performance liquid chromatography/mass spectrometry (HPLC/MS), and the deuterium substitution ratio and the ratio of D6 of benzene-d6 were measured through gas chromatography/mass spectrometry (GC/MS). The lifetime was measured in the same manner as in the device evaluation method of Experimental Example 2.

TABLE 6

| | | Benzene-d6 | | | Deuterium | |
|---|---|---|---|---|---|---|
| | No. | Deuterium Substitution Ratio (%) | Ratio of D6 (%) | TfOH (eq.) | Substitution Ratio (%) of Chemical Formula 2 | Lifetime |
| Synthesis Example 1 | 1 | 99.5 | 97.7 | 0.5 | 90.4 | 150 |
| Synthesis Example 2 | 2 | 94.9 | 72.8 | 0.73 | 87.3 | 146 |
| Synthesis Example 3 | 3 | 90.4 | 56.1 | 0.85 | 83.1 | 135 |
| Synthesis Example 4 | 4 | 87.4 | 47.5 | 0.85 | 79.0 | 135 |

Through Table 6, it was identified that varying benzene-d6 having different deuterium substitution ratio and D6 ratio of benzene affected the deuterium substitution ratio of Chemical Formula 2, and furthermore, affected performance (lifetime) of the device using the same as well.

The invention claimed is:

1. A composition comprising:

two or more compounds represented by the following Chemical Formula 1 and having a different number of deuterium substitution,

[Chemical Formula 1]

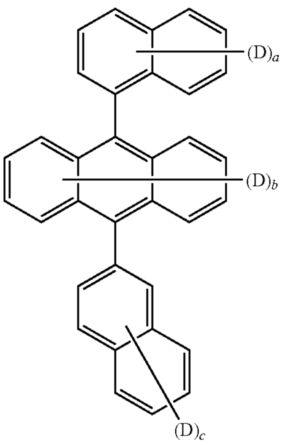

in Chemical Formula 1, a to c are each the number of deuterium, and a sum of a to c is 1 or greater and 22 or less;

a and c are each an integer of 0 to 7; and b is an integer of 0 to 8, wherein, in the composition, a number of deuterium of an isotope having a highest isotope content among each isotope content for each mass number of the two or more compounds is 12 or greater, and wherein, in the composition, a sum of the each isotope content for each mass number of the two or more compounds having the number of deuterium substitution of 12 or greater is 70% or greater.

2. The composition of claim 1, wherein the isotope content for each mass number of the two or more compounds is a value derived by analyzing a mass chromatogram of the composition obtained using chromatography.

3. The composition of claim 1, wherein the isotope content for each mass number of the two or more compounds is a value calculated based on an area of a mass chromatogram of the composition obtained using chromatography.

4. The composition of claim 1, wherein, in the composition, a sum of the each isotope content for each mass number of the two or more compounds having a number of deuterium equal to or higher than the number of deuterium of the isotope having a highest isotope content is 40% or greater and 75% or less.

5. An electronic device comprising the composition of claim 1.

6. An organic light emitting device comprising:

a first electrode;

a second electrode provided opposite to the first electrode; and an organic material layers provided between the first electrode and the second electrode, wherein the organic material layer includes the composition of claim 1.

7. The organic light emitting device of claim 6, wherein the organic material layer includes a light emitting layer, and the light emitting layer includes the composition.

8. The organic light emitting device of claim 7, wherein the light emitting layer includes a host and a dopant, and the host includes the composition.

* * * * *